(12) United States Patent
Yang et al.

(10) Patent No.: US 11,209,943 B2
(45) Date of Patent: Dec. 28, 2021

(54) OLED TOUCH DISPLAY PANEL AND TOUCH DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Minghua Xuan, Beijing (CN); Lei Wang, Beijing (CN); Jie Fu, Beijing (CN); Li Xiao, Beijing (CN); Pengcheng Lu, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 742 days.

(21) Appl. No.: 16/074,107

(22) PCT Filed: Jan. 3, 2018

(86) PCT No.: PCT/CN2018/070077
§ 371 (c)(1),
(2) Date: Jul. 31, 2018

(87) PCT Pub. No.: WO2018/205649
PCT Pub. Date: Nov. 15, 2018

(65) Prior Publication Data
US 2021/0208715 A1    Jul. 8, 2021

(30) Foreign Application Priority Data

May 10, 2017 (CN) .......................... 201710328879.6

(51) Int. Cl.
*G06F 3/044* (2006.01)
*G06F 3/041* (2006.01)
(Continued)

(52) U.S. Cl.
CPC .......... *G06F 3/0443* (2019.05); *G06F 3/0412* (2013.01); *G06F 3/0444* (2019.05);
(Continued)

(58) Field of Classification Search
CPC ..... G06F 3/0412; G06F 3/0446; G06F 3/0444
See application file for complete search history.

(56) References Cited

U.S. PATENT DOCUMENTS

2011/0242027 A1    10/2011  Chang
2013/0155012 A1*   6/2013   Chang ................... G06F 3/0448
                                                        345/174
(Continued)

FOREIGN PATENT DOCUMENTS

CN    104793820 A    7/2015
CN    104952888 A    9/2015
(Continued)

OTHER PUBLICATIONS

Search Report and Written Opinion for International Application No. PCT/CN070077 dated Mar. 30, 2018.
(Continued)

*Primary Examiner* — Kevin M Nguyen
(74) *Attorney, Agent, or Firm* — Calfee, Halter & Griswold LLP

(57) ABSTRACT

An OLED touch display panel and a touch display device are disclosed. The OLED touch display panel includes a TFT back plate and a cathode layer disposed on the TFT back plate. The cathode layer includes a plurality of touch leads which are insulated from each other and a plurality of self-capacitance electrodes which are insulated from each other and arranged in a form of a matrix. The touch leads extend to a non-display region of the OLED touch display panel. Each one of the touch leads is connected with one of the self-capacitance electrodes, and resistance values of the (Continued)

touch leads connected with the self-capacitance electrodes of a same row are all consistent.

18 Claims, 7 Drawing Sheets

(51) Int. Cl.
  *H01L 27/32* (2006.01)
  *H01L 51/52* (2006.01)
(52) U.S. Cl.
  CPC .......... *G06F 3/0446* (2019.05); *H01L 27/323* (2013.01); *H01L 27/3246* (2013.01); *H01L 51/5221* (2013.01); *H01L 2251/301* (2013.01)

(56) References Cited

U.S. PATENT DOCUMENTS

| 2013/0162596 | A1* | 6/2013 | Kono | G06F 3/0445 |
| | | | | 345/174 |
| 2015/0286317 | A1* | 10/2015 | Shepelev | G06F 3/0412 |
| | | | | 345/174 |
| 2016/0313844 | A1 | 10/2016 | Chen et al. | |
| 2017/0024046 | A1* | 1/2017 | Lee | H01L 27/3262 |
| 2017/0024075 | A1* | 1/2017 | Chiang | G06F 3/0445 |
| 2017/0097703 | A1 | 4/2017 | Lee | |
| 2017/0097727 | A1 | 4/2017 | Wu et al. | |
| 2017/0280531 | A1* | 9/2017 | Tada | H01L 27/3206 |

FOREIGN PATENT DOCUMENTS

| CN | 205121533 U | 3/2016 |
| CN | 205193765 U | 4/2016 |
| CN | 106066740 A | 11/2016 |
| CN | 106371666 A | 2/2017 |
| CN | 206039474 U | 3/2017 |
| CN | 106560779 A | 4/2017 |
| CN | 107168574 A | 9/2017 |

OTHER PUBLICATIONS

First Office Action for Chinese Patent Application No. 201710328879.6 dated Jul. 6, 2018.

* cited by examiner

OLED TOUCH DISPLAY PANEL AND TOUCH DISPLAY DEVICE

RELATED APPLICATION

The present application is the U.S. national phase entry of PCT/CN2018/070077, with an international filing date of Jan. 3, 2018, which claims the priority right of Chinese patent application No. 201710328879.6 filed on May 10, 2017, the entire content of which are incorporated herein by reference.

TECHNICAL FIELD

This disclosure relates to the field of display technology, particularly to an OLED touch display panel and a touch display device.

BACKGROUND

Active matrix organic light emitting diode (AMOLED) displays have advantages of low manufacturing costs, fast response speed, low power consumption, DC drive applicable to portable devices, and a large range of operation temperatures, etc., and hence are expected to be the next generation of new type flat displays replacing liquid crystal displays (LCDs). In particular, flexible AMOLEDs are attracting more and more attention on the market since they are light, thin, bendable or collapsible, and arbitrarily variable in shape.

An AMOLED usually needs an encapsulation cover plate as a barrier to water and oxygen. The encapsulation cover plate is manufactured normally through a glass cover plate process or a thin film encapsulation (TFE) process. When adopting the TFE process, normally, a Multi-Layer-On-Cell touch structure is directly manufactured on a thin film encapsulation structure, which, for example, has been adopted in a cell phone of Galaxy S6 made by Samsung. However, the Multi-Layer-On-Cell touch structure involves complicated manufacture processes and higher costs.

SUMMARY

One aspect of embodiments of this disclosure provides an OLED touch display panel, comprising a TFT back plate and a cathode layer disposed on the TFT back plate. The cathode layer comprises a plurality of touch leads which are insulated from each other and a plurality of self-capacitance electrodes which are insulated from each other and arranged in a form of matrix. The touch leads extend to a non-display region of the OLED touch display panel. Each one of the touch leads is connected with one of the self-capacitance electrodes, and resistance values of the touch leads connected with the self-capacitance electrodes of a same row are all consistent.

In an embodiment, in a left half part of the OLED touch display panel, from left to right, widths of touch leads connected with self-capacitance electrodes of a first column are the same as widths of touch leads connected with self-capacitance electrodes of a second column, and lengths of the touch leads connected with the self-capacitance electrodes of the first column are the same as lengths of the touch leads connected with the self-capacitance electrodes of the second column. Except for the self-capacitance electrodes of the first column, lengths and widths of touch leads connected with the self-capacitance electrodes of other columns increase successively. In a right half part of the OLED touch display panel, from right to left, widths of touch leads connected with self-capacitance electrodes of a first column are the same as widths of touch leads connected with self-capacitance electrodes of a second column, and lengths of the touch leads connected with the self-capacitance electrodes of the first column are the same as lengths of the touch leads connected with the self-capacitance electrodes of the second column. Except for the self-capacitance electrodes of the first column, lengths and widths of touch leads connected with the self-capacitance electrodes of other columns increase successively.

In an embodiment, the self-capacitance electrode is in a rectangular shape. In a left half part of the OLED touch display panel, from left to right, areas of the self-capacitance electrode increases gradually. In a right half part of the OLED touch display panel, from right to left of, areas of the self-capacitance electrode increases gradually.

In an embodiment, in any one of the left half part or the right half part of the OLED touch display panel, a sum of widths of touch leads connected with self-capacitance electrodes of a same row is less than or equal to 10% of a width of a self-capacitance electrode with the largest area in the same row. Width directions of the touch lead and width directions of the self-capacitance electrodes are both perpendicular to extending directions of the touch leads.

In an embodiment, in the left half part of the OLED touch display panel, from left to right, the widths of touch leads connected with the self-capacitance electrodes of the first column and the second column is the same as a width of a sub-pixel of the OLED touch display panel.

In an embodiment, in the right half part of the OLED touch display panel, from right to left, the widths of the touch leads connected with the self-capacitance electrodes of the first column and the second column is the same as a width of a sub-pixel of the OLED touch display panel.

In an embodiment, the OLED touch display panel further comprises a plurality of L-shape baffles disposed on the TFT back plate and a plurality of strip-shape baffles parallel to a horizontal edge of the L-shape baffle. In a left half part of the OLED touch display panel, from left to right, sizes of the plurality of L-shape baffles increase successively, or in a right half part of the OLED touch display panel, from right to left, sizes of the plurality of L-shape baffles increase successively.

In an embodiment, vertical edges of two adjacent L-shape baffles are respectively connected with two ends of one of the strip-shape baffles. The vertical edges of the two adjacent L-shape baffles and the one of the strip-shape baffles define a touch region, and the horizontal edges of the two adjacent L-shape baffles define a lead region connected with the touch region.

In an embodiment, the L-shape baffle and the strip-shape baffle partition the cathode layer into the self-capacitance electrode located within the touch region and the touch leads located within the lead region.

In an embodiment, in the left half part of the OLED touch display panel, from left to right, or in the right half part of the OLED touch display panel, from right to left, opening directions of two adjacent L-shape baffles for defining the touch regions of the first column are arranged oppositely, and opening directions of two adjacent L-shape baffles of other columns are the same.

In an embodiment, except for the touch regions of the first row, a horizontal edge of an inner-most L-shape baffle in a row for defining a touch region of a previous row is shared by a strip-shape baffle for defining a touch region of a next row.

In an embodiment, the OLED touch display panel further comprises a pixel definition layer disposed on the TFT back plate. The pixel definition layer comprises pixel partitions crossing each other transversely and longitudinally, and an opening enclosed by the pixel partitions. The L-shape baffle and the strip-shape baffle are located on a side of the pixel partition away from the TFT back plate.

In an embodiment, shapes of longitudinal sections of the L-shape baffle and the strip-shape baffle are inverted trapezoids, and the longitudinal sections are perpendicular to the TFT back plate.

In an embodiment, the OLED touch display panel further comprises spacers within the touch region disposed on the TFT back plate. The L-shape baffle and the strip-shape baffle are in a same layer with the spacers and have a same material with the spacers, and the L-shape baffle and the strip-shape baffle are made of negative photoresist.

In an embodiment, the spacers comprise a plurality of first sub-spacers and a plurality of second sub-spacers. The plurality of first sub-spacers are arranged in a form of a matrix, and the second sub-spacers are located between two adjacent rows and two adjacent columns of first sub-spacers. An extending direction of the first sub-spacer is perpendicular to an extending direction of the second sub-spacer.

In an embodiment, the OLED touch display panel further comprises an organic material functional layer. The organic material functional layer comprises a hole injection layer, a hole transport layer, a padding layer, a buffer layer, an organic light emitting layer and an electron transport layer successively located on a side of the TFT back plate close to the cathode layer. The hole injection layer, the hole transport layer, the buffer layer and the electron transport layer completely cover a display region of the TFT back plate. The organic light emitting layer and the padding layer correspond to positions of the openings.

In an embodiment, the OLED touch display panel further comprises an organic material functional layer. The organic material functional layer comprising a hole injection layer, a hole transport layer, a padding layer, a buffer layer, an organic light emitting layer and an electron transport layer successively located on a side of the TFT back plate close to the cathode layer and corresponding to positions of the openings.

In an embodiment, the cathode layer comprises at least one of metallic magnesium and metallic silver.

The other aspect of embodiments of this disclosure provides a touch display device, comprising an OLED touch display panel as stated in any of the above embodiments.

BRIEF DESCRIPTION OF THE DRAWINGS

In order to illustrate the technical solutions in the embodiments of this disclosure more clearly, drawings to be used in description of the embodiments of this disclosure will be briefly introduced below. The drawings in the descriptions below are only some embodiments of this disclosure. For a person having ordinary skills in the art, other drawings can be further obtained from these drawings without any inventive efforts.

DETAILED DESCRIPTION

The technical solutions in the embodiments of this disclosure shall be described clearly and completely as follows with reference to the drawings in the embodiments of this disclosure. Obviously, the described embodiments are only part of the embodiments of this disclosure, instead of all. Based on the embodiments in this disclosure, all other embodiments obtainable by a person having ordinary skills in the art without any inventive efforts shall fall within the protection scope of this disclosure.

Reference signs: 10—TFT back plate; 20—cathode layer; 201—self-capacitance electrode; 202—touch lead; 11—L-shape baffle; 11'—strip-shape baffle; 101—touch region; 102—lead region; 110a—first sub-spacer; 110b—second sub-spacer; 110—spacer; 13—metal film layer; 14—touch IC; 15—encapsulation cover plate; 16—multilayer touch structure; 17—display driving chip; A—display region of the OLED touch display panel; B—non-display region of the OLED touch display panel; 30—pixel definition layer; 301—pixel partition; 302—opening; 401—hole injection layer; 402—hole transport layer; 403—organic light emitting layer; 404—electron transport layer; 405—padding layer; 406—buffer layer; 407—capping layer.

Figure 1:
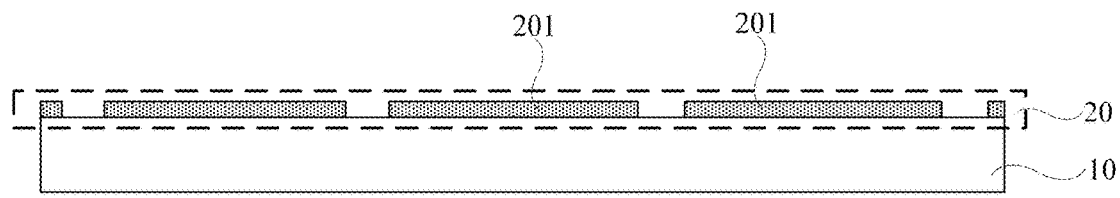
FIG. 1 is a schematic view of a structure of an OLED touch display panel provided by an embodiment of this disclosure.

An embodiment of this disclosure provides an OLED touch display panel, as shown in FIG. 1, comprising a TFT back plate 10 and a cathode layer 20 disposed on the TFT back plate 10.

Figure 2:
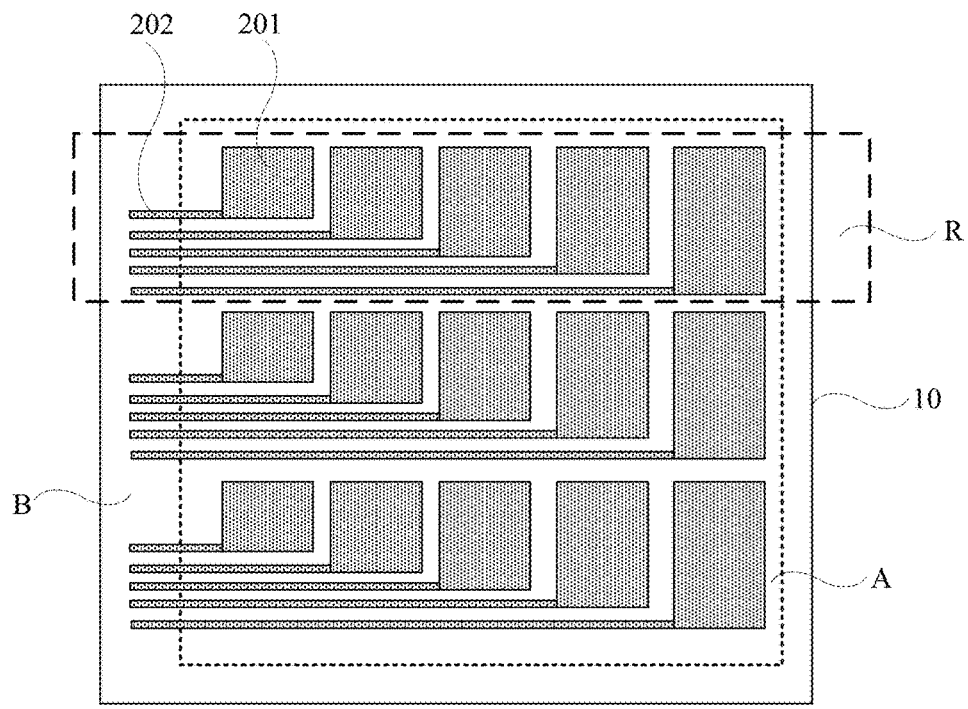
FIG. 2 is a schematic view of a multiplexing structure of the cathode layer in FIG. 1 and the self-capacitance electrode.

The cathode layer 20 as shown in FIG. 2 comprises a plurality of touch leads 202 which are insulated from each other and a plurality of self-capacitance electrodes 201 which are insulated from each other and arranged in a form of a matrix. The touch leads 202 extend to a non-display region B of the OLED touch display panel.

Each touch lead 202 is connected with one self-capacitance electrode 201, and resistance values of the touch leads 202 connected with the self-capacitance electrodes 201 of a same row are all consistent.

It should be noted that the word "consistent" in the above expression "resistance values of the touch leads 202 connected with the self-capacitance electrodes 201 of a same row are all consistent" means that, in a range allowed by design and manufacture tolerances, the resistance values of the touch leads 202 connected with the self-capacitance electrodes 201 of a same row are same or approximately same. Specifically, the range may be 90%-100%, meaning that, in the same row, the resistance value of a first self-capacitance electrode is 90%-100% of that of a second self-capacitance electrode. For example, in the same row, the resistance value of the first self-capacitance electrode is 91%, 92%, 93%, 94%, 95%, 96%, 97%, 98%, 99% or 100%, etc., of that of a second self-capacitance electrode.

In addition, in order to save the wiring space and simplify the wiring process, for example, the plurality of touch leads 202 connected with self-capacitance electrodes 201 of the same row are arranged parallel to each other. In such a case, the extending direction of "row (R)" in the above expression "self-capacitance electrodes 201 of the same row" is same as the extending direction of the plurality of touch leads 202 connected with the self-capacitance electrodes 201 of this row.

Figure 3A:
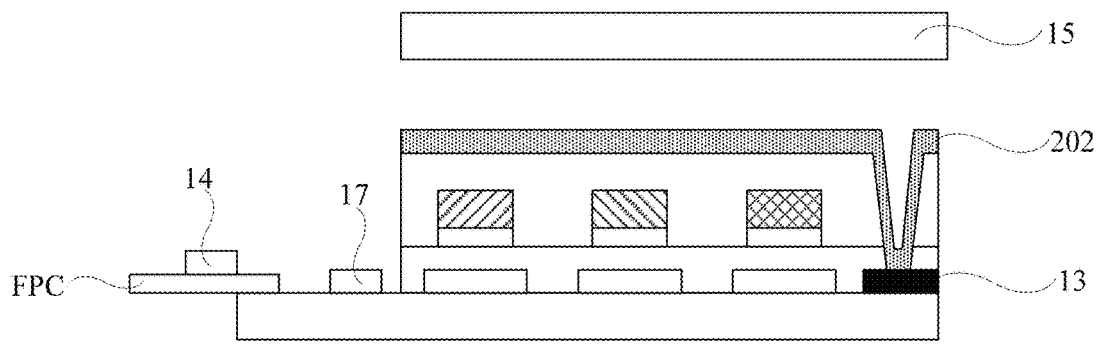
FIG. 3A is a schematic view of a connection structure of the touch leads as shown in FIG. 2 in a non-display region.
Figure 3B:
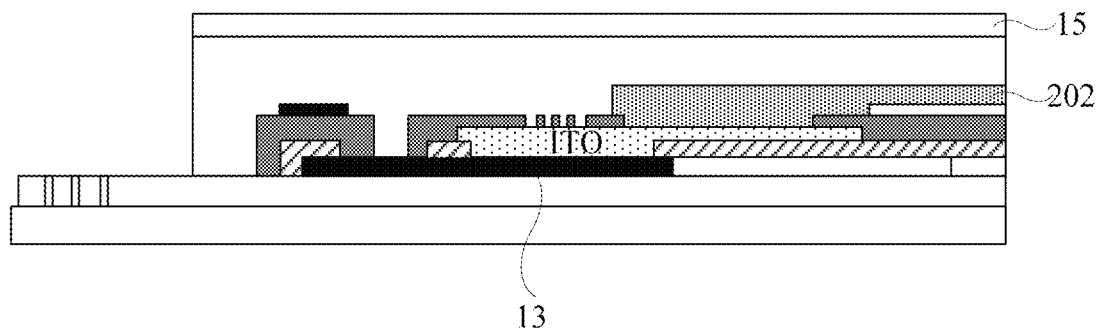
FIG. 3B is a schematic view of a specific connection structure of the metal film layer and the touch lead as shown in FIG. 3A in a non-display region.
Figure 4:
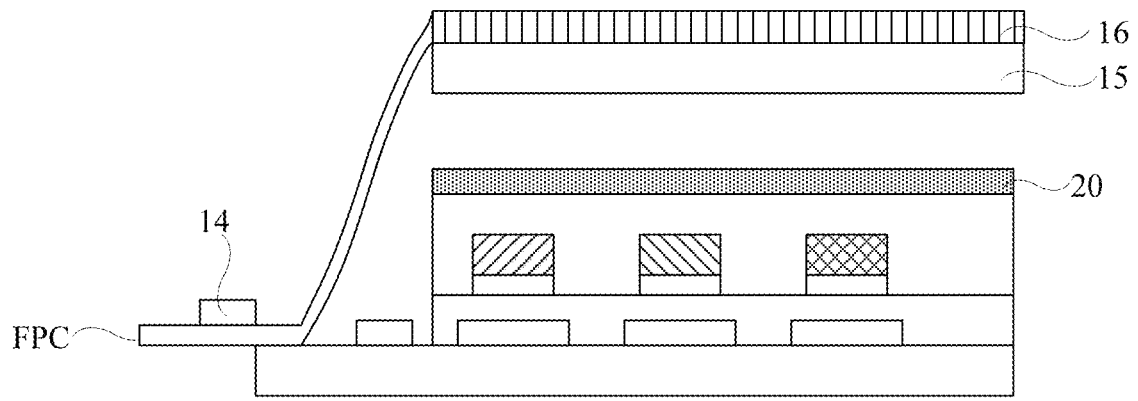
FIG. 4 is a schematic view of a known on-cell touch structure.

From the above it can be seen that, on the one hand, since the cathode layer 20 comprises a plurality of self-capacitance electrodes 201 which are insulated from each other and arranged in a form of matrix, the cathode layer 20 can be used as the self-capacitance electrodes 201. That is, when the OLED touch display panel is in a display stage, a voltage is applied to the cathode layer 20, so that the cathode layer 20 forms an electric field with the anode on the TFT back plate 10, thereby exciting the organic light emitting layer located between the cathode layer 20 and the anode in the OLED touch display panel to emit light. When the OLED touch display panel is in the touch stage, each of the self-capacitance electrodes 201 can be electrically connected with a metal film layer 13 in the non-display region B as shown in FIG. 3A through the touch lead 202 connected with it. Specifically, as shown in FIG. 3B, the touch lead 202 is electrically connected with the metal film layer 13 through a transparent conductive film layer (e.g., the ITO as shown in FIG. 3B, the transparent conductive film layer is formed by such as indium tin oxide). The metal film layer 13 is further connected with the ground end (GND) or a low voltage end (VSS), so as to enable the self-capacitance electrode 201 to constitute self-capacitance with the ground end or the low voltage end. Moreover, when the plurality of self-capacitance electrodes 201 are arranged in a form of a matrix, the self-capacitance electrodes 201 of N rows and M columns can be scanned (i.e., performing scanning for N+M times), so as to determine the touch position based on the coordinates of the self-capacitance whose capacitance value changes. In this way, an in-cell touch structure with a simple structure as shown in FIG. 3A can be realized by multiplexing the cathode layer 20 with the self-capacitance electrode 201. Therefore, there is no need to adopt the scheme of arranging a multilayer touch structure 16 on the outer side of the encapsulation cover plate 15 as shown in FIG. 4, hence, the structure of the OLED touch display panel is simplified. The above N and M are positive integers greater than or equal to 2.

On the other hand, the metal film layer 13 in FIG. 3A, connects not only with the ground end or the low voltage end of the non-display region B, but also with a touch IC 14 in the non-display region B on the FPC, to output the signal collected by the touch lead 202 to the touch IC 14. In such a case, since the resistance values of the touch leads 202 connected with the self-capacitance electrodes 201 of the same row are all consistent, the resistance values of the touch leads 202 per se connected with the self-capacitance electrodes 201 of the same row have the same influence to the signal inputted by each touch lead 202 to the self-capacitance electrode 201 connected therewith and to the collected signal outputted to the touch IC 14. Thus, by performing an equal resistance design to the touch leads 202, the influence of the IR-drop phenomenon caused by lead resistance difference on the display and touch performance of the OLED touch display panel can be reduced.

In yet another aspect, if the material of the cathode layer 20 is a metallic material such as at least one of metallic magnesium (Mg) and metallic silver (Ag), since metals have good ductility, when the OLED touch display panel is applied to the field of flexible display, a better bending effect can be achieved, thereby solving the defect that in case a multi-layer thin film On Cell touch structure is used, it cannot satisfy the requirement of bendability for the electrode inside it is made of transparent conductive materials.

On this basis, in order to enable the consistency of the resistance values of the touch leads 202 connected with the self-capacitance electrodes 201 of the same row, the setting manners of the self-capacitance electrode 201 and the touch lead 202 will be explained below.

Figure 5:
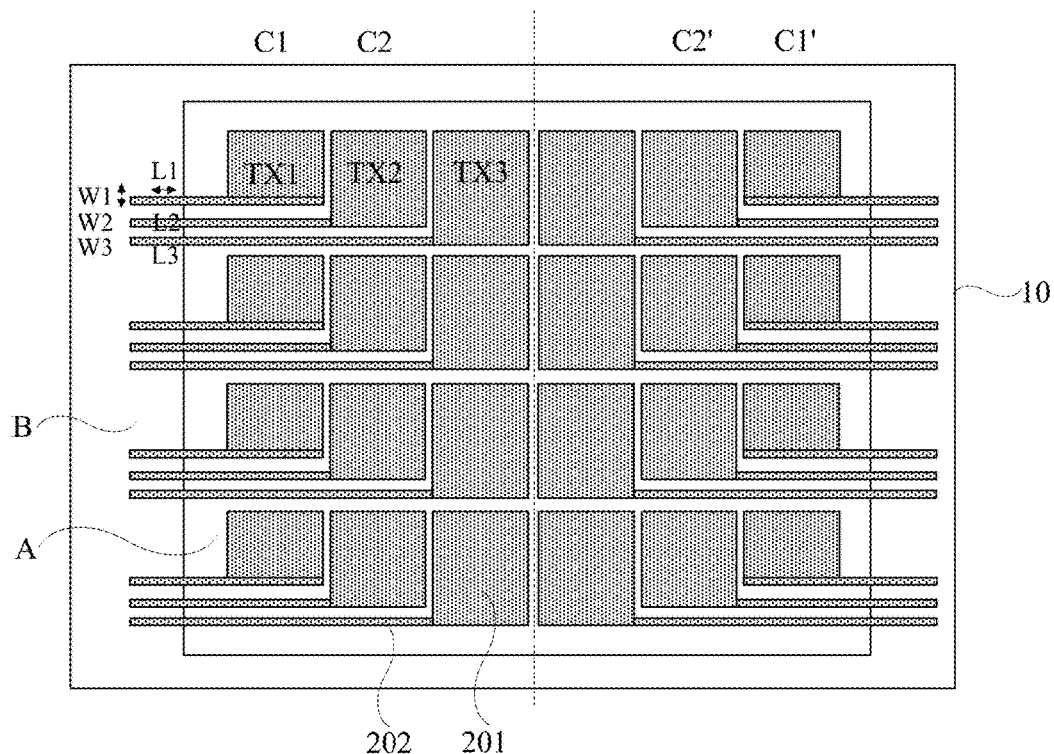
FIG. 5 is a schematic view of arrangement structure of the self-capacitance electrode in FIG. 1 and the touch lead.

Specifically, as shown in FIG. 5, in order to enable the plurality of touch leads 202 connected with the self-capacitance electrodes 201 of the same row to have enough wiring space, for example, the display region A of the OLED touch display panel is divided into left half screen and right half screen. In the left half screen, the plurality of touch leads 202 connected with the self-capacitance electrodes 201 of the same row extend to the non-display region B at the left half part of the OLED touch display panel. In the right half screen, the plurality of touch leads 202 connected with the self-capacitance electrodes 201 of the same row extend to the non-display region B at the right half part of the OLED touch display panel.

It should be noted that the position terms such as "left" and "right" in the present application are defined relative to the arranged orientation of the OLED touch display panel shown in the drawings. It should be understood that these directional terms are concepts of relativity, and they are used for description and clarification of relativity which can be changed correspondingly based on the change of the position of the OLED touch display panel.

On the basis of this, from left to right of the left half part of the OLED touch display panel, it is arranged the first column C1 of self-capacitance electrodes and the second column C2 of self-capacitance electrodes. The widths W of the touch leads 202 connected with self-capacitance electrodes 201 of a first column C1 are the same as the widths W of the touch leads 202 connected with self-capacitance electrodes 201 of a second column C2, and the lengths L of the touch leads 202 connected with the self-capacitance electrodes 201 of the first column C1 are the same as the lengths L of the touch leads 202 connected with the self-capacitance electrodes 201 of the second column C2. In addition, in every row of the self-capacitance electrodes, except from the self-capacitance electrodes 201 of the first column C1, lengths L and widths W of touch leads 202 connected with other self-capacitance electrodes of the row increase successively.

In addition, from right to left of the right half part of the OLED touch display panel, it is arranged the first column C1' of self-capacitance electrodes and the second column C2' of self-capacitance electrodes. The widths W of the touch leads 202 connected with self-capacitance electrodes 201 of a first column C1' are the same as the touch leads 202 connected with self-capacitance electrodes 201 of a second column C2', and the lengths L of the touch leads 202 connected with the self-capacitance electrodes 201 of the first column C1' are the same as the lengths L of the touch leads 202 connected with the self-capacitance electrodes 201 of the second column C2'. In addition, in every row of the self-capacitance electrodes, except from the self-capacitance electrodes 201 of the first column C1', lengths L and widths W of touch leads 202 connected with the other self-capacitance electrodes of the row increase successively.

From above, it can be seen that from left to right of the left half part of the OLED touch display panel or, from right to left of the right half part of the OLED touch display panel, the width W1 of the touch lead 202 connected with the self-capacitance electrode 201 of the first column C1 is same as the width W2 of the touch lead 202 connected with the capacitive electrode 201 of the second column C2. The width of the touch lead 202 is the line width of the touch lead 202. Moreover, the length L1 of the touch lead 202 connected with the self-capacitance electrode 201 of the first column C1 is same as the length L2 of the touch lead 202 connected with the self-capacitance electrode 201 of the second column C2. The extending direction of the length of the touch lead 202 is same as the extending direction of the self-capacitance electrodes 201 of this row.

In addition, from left to right of the left half part of the OLED touch display panel or, from right to left of the right half part of the OLED touch display panel, except for the self-capacitance electrodes 201 of the first columns C1 and C1', the lengths L and the widths W of the touch leads 202 connected with self-capacitance electrodes 201 of other columns respectively increase successively.

Specifically, take the three adjacent self-capacitance electrodes TX1, TX2 and TX3 in the first row in the left half part of the OLED touch display panel as the example, the relation between the widths W1, W2 and W3 of three touch leads 202 connected with TX1, TX2 and TX3 respectively is: W1=W2=M×W3; wherein 0<M<1, and M is a positive number. For example, M can be 0.5.

In addition, the relation between the lengths L1, L2 and L3 of the three touch leads 202 connected with TX1, TX2 and TX3 respectively is: L1=L2=M×L3.

In such a case, since the resistance value of the touch lead 202 is in inverse proportion to its width W and is in direct proportion to its length L, when the lengths L and the widths W of the three touch leads 202 connected with the self-capacitance electrodes TX1, TX2 and TX3 respectively increase progressively, the resistance values of the three touch lead 202 can keep the same or approximately the same, so as to realize equal resistance design. By doing this, the influence on the display and touch performance of the OLED touch display panel by the IR-drop phenomenon caused by lead resistance difference can be reduced.

Certainly, the above illustration is only made with respect to the setting manners of the lengths and the widths of the self-capacitance electrodes TX1, TX2 and TX3. When the left half part or the right half part of the OLED touch display panel comprises more than three columns of self-capacitance electrodes 201, the lengths and the widths of the touch leads 202 connected with the self-capacitance electrodes 201 of the same row increase with the increase of the number of the column of the self-capacitance electrodes 201 in the left half part or the right half part of the OLED touch display panel. For example, for either the left half screen or the right half screen, the lengths and the widths of the plurality of touch leads 202 connected with the self-capacitance electrodes 201 of the same row increase gradually in the form of an arithmetic progression, so as to be easy to realize the equal resistance design.

In such a case, when the sum of the widths of all the touch leads 202 connected with the self-capacitance electrodes 201 of the same row is too large, in the touch process, the press position of the finger will correspond to the positions of a plurality of touch leads 202 rather than substantially correspond to the position of a certain self-capacitance electrode 201. Thus, which self-capacitance electrode 201 has a position corresponding to the touch position could not be determined, thereby producing a touch blind zone and reducing the user experience.

In order to solve the above problem, for example, in either the left half part or the right half part of the OLED touch display panel, the sum of the widths of the touch leads 202 connected with the self-capacitance electrodes 201 of the same row is less than or equal to 10% of the width of the self-capacitance electrode 201 having the largest area in this row.

The width direction of the touch lead 202 and the width direction of the self-capacitance electrode 201 are both perpendicular to the extending direction of the touch lead 202.

In this way, the sum of the widths of all the touch leads 202 connected with the self-capacitance electrodes 201 of the same row can be controlled effectively so as to enable any press position in the touch process to substantially correspond to the position of a certain self-capacitance electrode 201, thereby providing benefit for reducing the touch blind zone and improving the touch precision.

On this basis, in order to further improve uniformity of the display brightness, in an embodiment, the self-capacitance electrodes 201 have rectangular shapes, e.g., square shapes. From left to right of the left half part of the OLED touch display panel, the area of the self-capacitance electrode 201 increases gradually. In addition, from right to left of the right half part of the OLED touch display panel, the area of the self-capacitance electrode 201 increases gradually. In this way, by progressively increasing the areas of the self-capacitance electrodes 201 in the left half screen and the right half screen of the OLED touch display panel from the left and right edges to the middle, in the display process, when the plurality of self-capacitance electrodes 201 are charged as the cathode layer 20, the amount of the charged electricity will also increase progressively. In such a case, a human eye would not find the subtle difference in electricity between two adjacent self-capacitance electrodes 201, thereby enabling the display brightness of the OLED touch display panel to keep uniform. Moreover, in the process of performing multiple lighting effect tests to the OLED touch display panel, the applicant finds that, the brightness uniformity is good when the OLED touch display panel is displaying an image (e.g., stripe image).

It should be noted that the resolution of the OLED touch display panel is not limited by the present application. after the resolution has been increased, the self-capacitance electrode 201 and the touch lead 202 can still adopt the above setting manners. On this basis, when the resolution increases, in order to reduce the IR-drop phenomenon, the wiring space of the touch leads 202 connected with a part of self-capacitance electrodes 201 close to the central position of the OLED touch display panel can be increased, in the left half screen or the right half screen of the OLED touch display panel. In an embodiment, in the left half screen or the right half screen of the OLED touch display panel, the widths of the touch leads 202 connected with the self-capacitance electrodes 201 of the first column C1 (or C1') and the second column C2 (or C2') should be as small as possible.

In order to achieve the above purpose, from left to right of the left half part of the OLED touch display panel, the width of the touch leads 202 connected with the self-capacitance electrodes 201 of the first column C1 and the second column C2 is same as the width of a sub-pixel of the OLED touch display panel.

Alternatively, from right to left of the right half part of the OLED touch display panel, the width of the touch leads 202 connected with the self-capacitance electrodes 201 of the first column C1' and the second column C2' is same as the width of a sub-pixel of the OLED touch display panel.

Figure 6:
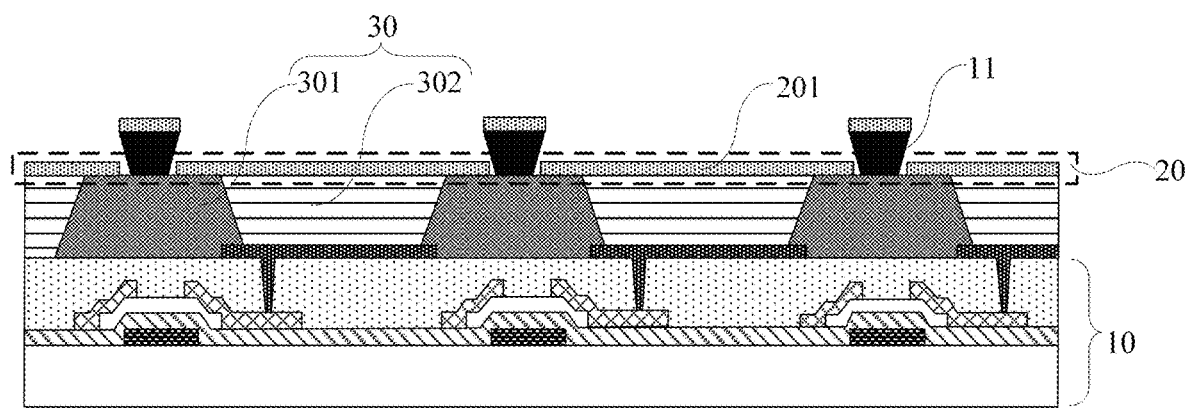
FIG. 6 is a schematic view of structure of an OLED touch display panel provided with L-shape baffles.
Figure 7:
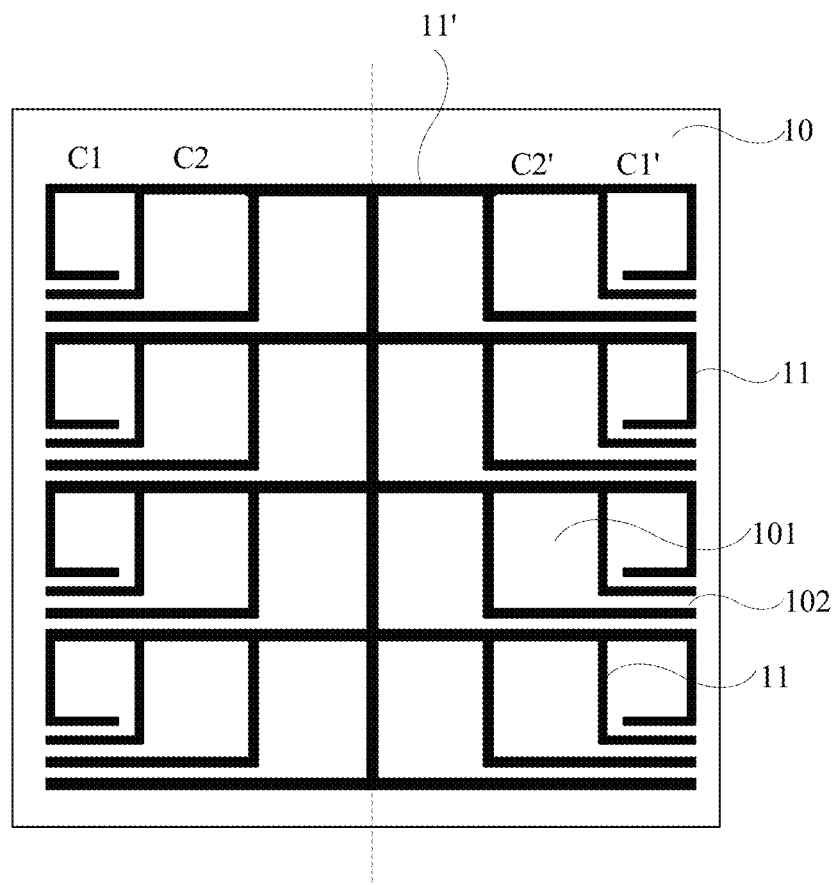
FIG. 7 is a schematic view of a plurality of touch regions defined by the L-shape baffles in FIG. 6 and the stripe-shape baffles.

On the basis of this, in order to form the plurality of self-capacitance electrodes 201 that can be multiplexed with the cathode 20 and the touch leads 202 connected with the respective self-capacitance electrodes 201, in an embodiment, the OLED touch display panel further comprises a plurality of L-shape baffles as shown in FIG. 7 disposed on the TFT back plate 10 as shown in FIG. 6 and a plurality of strip-shape baffles 11' parallel to the horizontal edge of the L-shape baffle 11. In addition, from left to right of the left half part the sizes of the plurality of L-shape baffles 11 increase successively, or from right to left of the right half part of the OLED touch display panel, the sizes of the plurality of L-shape baffles 11 increase successively.

Specifically, the vertical edges of two adjacent L-shape baffles 11 are connected with one strip-shape baffle 11' respectively. The vertical edges of the two adjacent L-shape baffles 11 and one strip-shape baffle 11' define a touch region 101. In addition, the horizontal edges of two adjacent L-shape baffles define a lead region 102 connected with the touch region 101.

Figure 8:
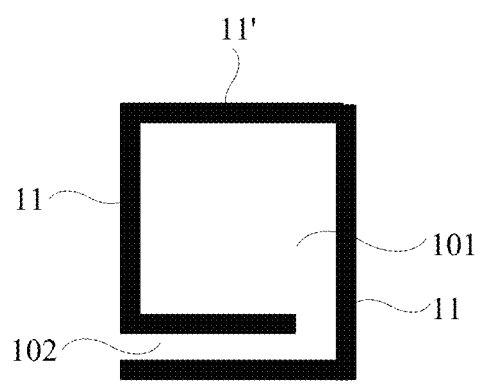
FIG. 8 is a schematic view of a structure of a touch region of the first column in FIG. 7.
Figure 9:
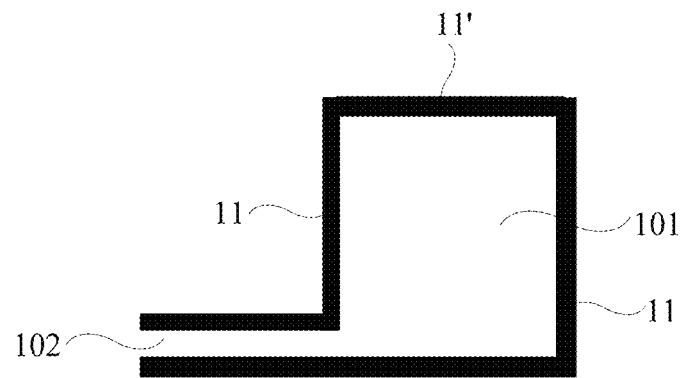
FIG. 9 is a schematic view of a structure of a touch region of columns other than the first column in FIG. 7.

Based on this, in an embodiment, from left to right of the left half part or from right to left of the right half part of the OLED touch display panel, two adjacent L-shape baffles 11 defining the touch regions 101 of the first column C1 (or C1') have arranged oppositely bending direction. FIG. 8 is a magnified schematic view of shape of a touch region 101 in the first column C1 (or C1') in FIG. 7. In addition, the bending directions (i.e. the opening directions) of two adjacent L-shape baffles 11 of other columns are same. FIG. 9 is a magnified schematic view of shape of a touch region 101 in the second column C2 (or C2') or a column after the second column C2 (or C2') in FIG. 7.

On this basis, except for the touch region of the first row, the horizontal edge of the inner-most L-shape baffle 11 in a row for defining the touch region 101 of a previous row is shared by a strip-shape baffle for defining a touch region of a next row.

It should be noted that the extending direction of the horizontal edge of the L-shape baffle 11 is same as the extending direction of the touch lead 202. In addition, the extending direction of the vertical edge of the L-shape baffle 11 is perpendicular to the extending direction of the touch lead 202.

Figure 10:
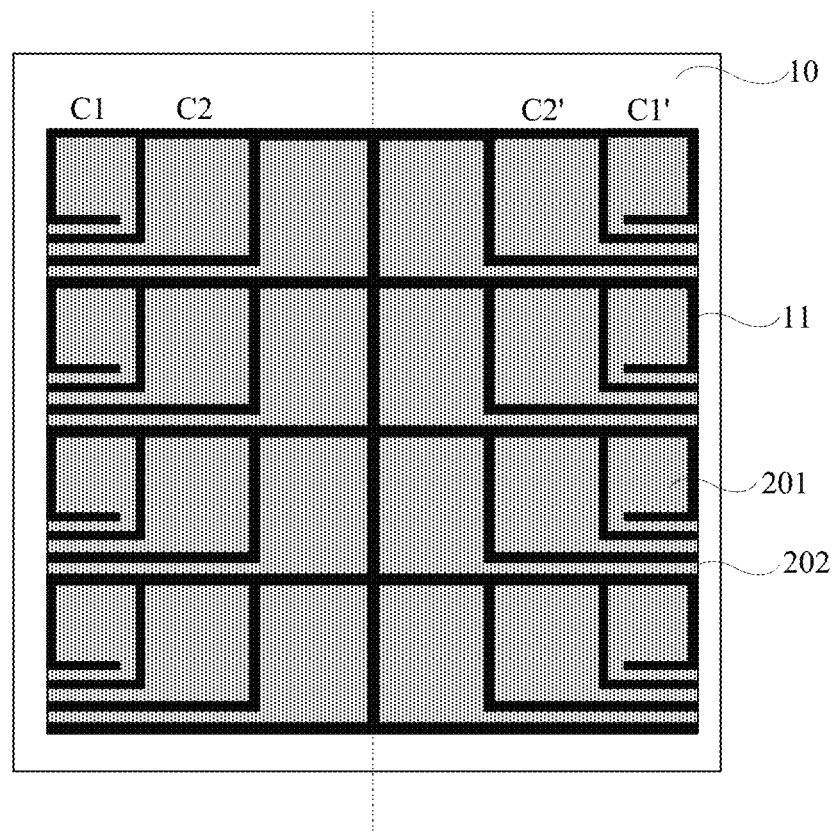
FIG. 10 is a schematic view of structures of self-capacitance electrodes and touch leads partitioned by the L-shape baffles and the strip-shape baffles as shown in FIG. 7.

In such a case, the L-shape baffle 11 and the strip-shape baffle 11' are used for, as shown in FIG. 10, dividing the cathode layer 20 into self-capacitance electrode 201 located in the touch region 101 and touch lead 202 located in the lead region 102.

To sum up, on the one hand, from left to right of the left half part or from right to left of the right half part of the OLED touch display panel, by increasing successively the sizes of a plurality of L-shape baffles 11, and oppositely defining the bending directions of two adjacent L-shape baffles 11 for defining the touch region 101 of the first column C1 (or C1'), and equally defining the opening directions of two adjacent L-shape baffles 11 of other columns, what is achieved is that, in a plurality of self-capacitance electrodes 201 formed by partitioning the cathode layer 20 by means of the L-shape baffles 11 and the strip-shape baffles 11', except the self-capacitance electrodes 201 of the first column C1, the lengths L and the widths W of the touch leads 202 connected with the self-capacitance electrodes 201 of other columns increase successively, and the areas of the self-capacitance electrodes 201 of the left half screen and the right half screen of the OLED touch display panel increase progressively to the middle, thereby providing benefit for realizing equal resistance design of the touch leads and improving uniformity of the display brightness.

In addition, on the other hand, the baffles can also support the encapsulation cover plate in the OLED touch display panel, such that the surface of the OLED touch display panel is flat.

On this basis, in order to avoid influencing the display effect, for example, the OLED touch display panel further comprises a pixel definition layer 30 disposed on the TFT back plate 10 as shown in FIG. 7. The pixel definition layer 30 comprises pixel partitions 301 crossing each other transversely and longitudinally and an opening 302 enclosed by the pixel partitions.

The L-shape baffle 11 and the strip-shape baffle 11' (not shown in FIG. 6) are located on a side of the pixel partition 301 away from the TFT back plate 10.

In this way, since the opening position 302 corresponds to the effective display region of each sub-pixel and the pixel partition 301 is located in the non-display region, when the baffle 11 is disposed on a side of the pixel partition 301 away from the TFT back plate, the shield by the baffle 11 to the effective display region can be avoided, thereby reducing the influence on the display effect.

On the basis of this, in order to partition the cathode layer 20 by means of the L-shape baffle 11 and the strip-shape baffle 11', for example, the shape of the longitudinal section of the L-shape baffle 11 and the strip-shape baffle 11' is an inverted trapezoid as shown in FIG. 6. The longitudinal section is perpendicular to the TFT back plate 10. In this way, when forming the cathode layer 20 on the substrate where the L-shape baffle 11 and the strip-shape baffle 11' have been formed, for example, when forming a MgAg alloy film layer by using the evaporation process, under the cutting effect of the angle between the long edge and the side edge of the L-shape baffle 11 and the strip-shape baffle 11', the cathode layer 20 can be disconnected, so as to form the self-capacitance electrode 201 within the touch region 102 defined by the L-shape baffle 11 and the strip-shape baffle 11', and form the touch lead 202 within the lead region 102 defined by the horizontal edges of two adjacent L-shape baffles 11.

Figure 11:
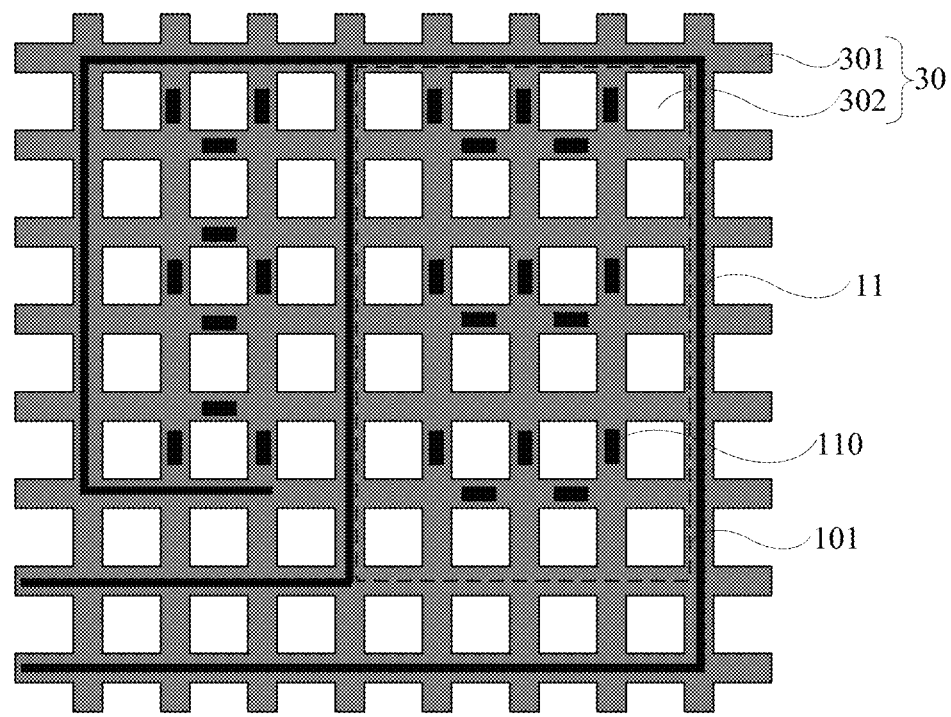
FIG. 11 is a schematic view of spacers disposed in the touch regions defined by the L-shape baffles and the strip-shape baffles as shown in FIG. 10.

It should be noted that the encapsulation cover plate 15 in the OLED touch display panel provided by the present application can be a cover plate glass or an encapsulation film layer. On the basis of this, in order to improve the manufacturing effect of the encapsulation cover plate 15, the evenness of the surface of the OLED touch display panel is further improved. In an embodiment, the OLED touch display panel further comprises a plurality of spacers 110 located within the touch region 101 as shown in FIG. 11. When the OLED touch display panel comprises the pixel definition layer 30, the spacer 110 can be located on a side of the pixel partition 301 of the pixel definition layer 30 away from the TFT back plate 10.

Because the spacer 110 is disposed within the touch region 101, the positions of the spacer 110 and the baffle 11 do not overlap.

Based on this, in order to simplify the manufacturing process and form the L-shape baffle 11 and the strip-shape baffle 11' whose longitudinal section is an inverted trapezoid, for example, the L-shape baffle 11 and the strip-shape baffle 11' are located in the same layer with the spacers 110 and comprise the same material with the spacers 110. In addition, the material of the L-shape baffle 11 and the strip-shape baffle 11' is negative photoresist. In such a case, the shapes of longitudinal sections of the spacer 110 formed through a single mask exposure (MASK) process, the L-shape baffle 11 and the strip-shape baffle 11' are all inverted trapezoid.

In addition, when forming the cathode layer 20 on the substrate where the spacer 110, the L-shape baffle 11 and the strip-shape baffle 11' have been formed, for example, when forming a MgAg alloy film layer using the evaporation process, under the cutting effect of the angle between the long edge and the side edge of the spacer 110, the L-shape baffle 11 and the strip-shape baffle 11', the cathode layer 20 can be disconnected. At this time, the surfaces of the spacer 110, the L-shape baffle 11 and the strip-shape baffle 11' have a floating film layer. Because the film layer is in an island shape, it has less influence on the OLED touch display panel.

On this basis, in order to reduce parasitic capacitances generated between the self-capacitance electrodes 201 and other electrodes on the TFT back plate 10, the number of the spacers 110 within the touch regions 101 can be increased, and the arrangement of the spacers 110 can be optimized.

Figure 12:
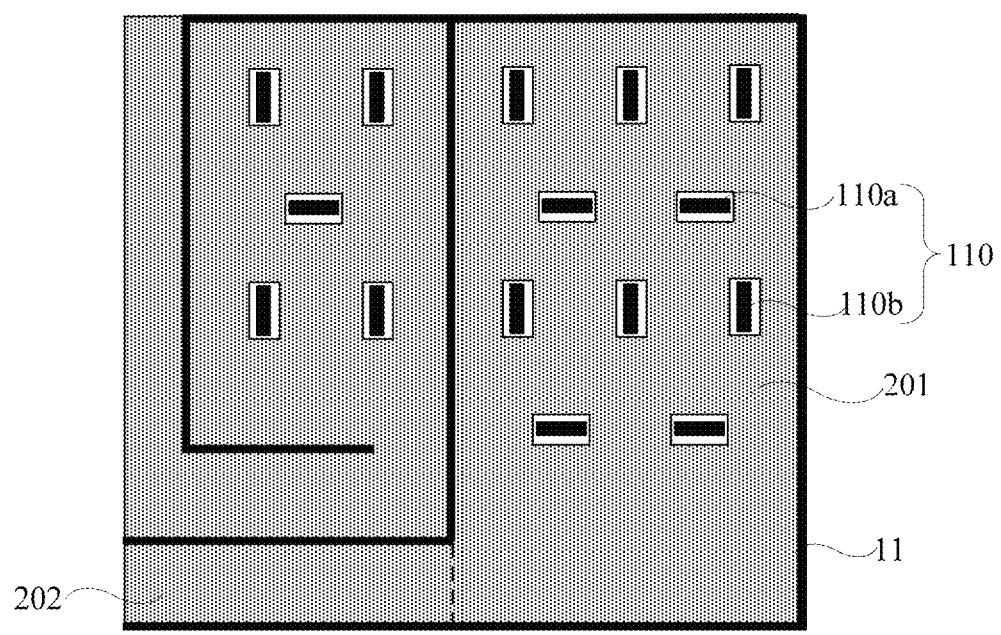
FIG. 12 is a schematic view of distribution of the spacers in FIG. 11.

Specifically, the spacers 110, as shown in FIG. 12 comprise a plurality of first sub-spacers 110a and a plurality of second sub-spacers 110b.

The plurality of first sub-spacers 110a is arranged in the form of a matrix. The second sub-spacers 110b are located between two adjacent rows and two adjacent columns of first sub-spacers 110a. An extending direction of the first sub-spacers 110a is perpendicular to an extending direction of the second sub-spacers 110b. In this way, more thin film layer in a floating state may be added within the touch regions 101 such that the area of the self-capacitance electrodes 201 is further reduced.

Based on the manufacturing process of the OLED touch display panel, after the spacer 110 on the pixel partition 301 of the pixel definition layer 30, the L-shape baffle 11 and the strip-shape baffle 11' are manufactured, before manufacturing the cathode layer 20, the manufacturing method of the OLED touch display panel further comprises forming an organic material functional layer at least within the opening of the pixel definition layer 30.

Next, the specific structure of the organic material functional layer will be illustrated.

Figure 13:
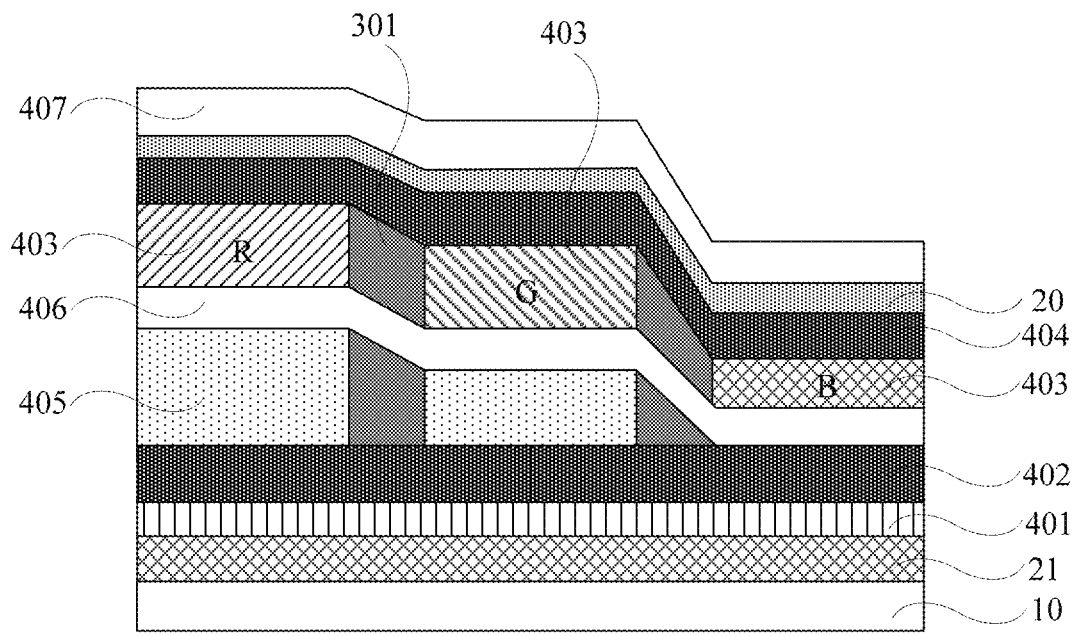
FIG. 13 is a schematic view of a structure of an organic material functional layer provided by the present application.

For example, as shown in FIG. 13, the organic material functional layer comprises a hole injection layer (HI) 401, a hole transport layer (HT) 402, a padding layer 405 for adjusting the height of the microcavity, a buffer layer (HTEB) 406 for increasing the transmission efficiency of the holes, an organic light emitting layer (EML) 403 and an electron transport layer (ET) 404 located on a side of the TFT back plate 10 close to the cathode layer 20 successively.

The hole injection layer 401, the hole transport layer 402, the buffer layer 406 and the electron transport layer 404 cover the display of the TFT back plate 10 completely. The organic light emitting layer 403 and the padding layer 405 correspond to the positions of the openings 302.

Specifically, the thicknesses of the hole injection layer 401 and the hole transport layer 402 are 50 Å and 1140 Å, respectively. The thickness of the buffer layer 406 can be 100 Å. The thickness of the electron transport layer 404 is 300 Å.

When the materials for forming the organic light emitting layer 403 are different, under the excitation effect of an electric field formed by the anode 21 and the cathode layer 20, different light rays can be emitted, including, for example, red light (R), green light (G) and blue light (B). The red (R) organic light emitting layer 403, the green (G) organic light emitting layer 40 and the blue (B) organic light emitting layer 403 have a thickness of 400 Å, 200 Å and 250 Å, respectively.

Figure 14:
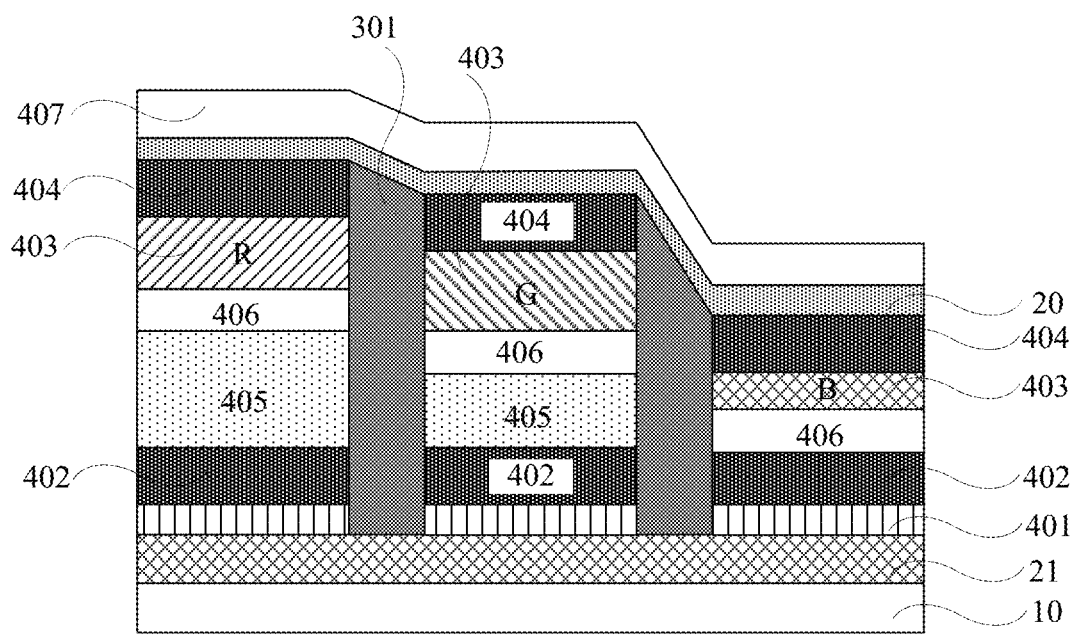
FIG. 14 is another schematic view of a structure of an organic material functional layer provided by the present application.

In addition, FIG. 14 is an illustration taking an example of the adjustment of the heights of the microcavities where the red (R) organic light emitting layer 403 and the green (G) organic light emitting layer 40 are located. When the height of the microcavity where the blue (B) organic light emitting layer 403 is located needs to be adjusted, the padding layer 405 can be formed in an opening position corresponding to the microcavity where the blue (B) organic light emitting layer 403 is located. Specifically, the padding layers 405 for adjusting the heights of the microcavities where the red (R) organic light emitting layer 403 and the green (G) organic light emitting layer 40 are located have a thickness of 730 Angstroms and 400 Angstroms, respectively.

As known from above, for the organic material functional layers having the above structure, only the organic light emitting layer 403 and the padding layer 405 correspond to the position of the opening 302, and the remaining thin film layer all covers the display region of the TFT back plate 10. Therefore, the organic light emitting layer 403 and the padding layer 405 can be formed by using a fine metal mask (FMM). The remaining thin film layer can simply use an ordinary mask plate. As a result, the number of FMMs can be reduced and the manufacture costs can be lowered.

Alternatively, in the event that the manufacturing cost is acceptable, as shown in FIG. 14, the structure of the organic material functional layer comprises a hole injection layer 401, a hole transport layer 402, a padding layer 405, a buffer layer 406, an organic light emitting layer 403 and an electron transport layer 404 successively located on a side of the TFT back plate 10 close to the cathode layer 20 and corresponding to the positions of the openings 302.

To sum up, because in the present application, as shown in FIG. 10, the touch lead 202 and the self-capacitance electrode 201 are structures in the same layer, no matter whether the structure of each OLED device itself is independent or not, the touch lead 202 can transmit signals to the self-capacitance electrode 201, thereby enabling each OLED device to operate normally. Therefore, the structures of the two organic material functional layers provided by FIG. 13 and FIG. 14 are both applicable for this scheme. Certainly, in order to simplify the manufacturing process and save the cost, for example, the manufacturing method as shown in FIG. 13 is adopted.

Based on that, after the organic material functional layer has been manufactured, a step of manufacturing the cathode layer 20 is executed. Moreover, a capping layer 407 can be further formed on the surface of the cathode layer 20 so as to improve the electric performance of the cathode layer 20. The capping layer 407 can have a thickness of 550 Angstroms.

An embodiment of this disclosure provides a touch display device, comprising the OLED touch display panel as stated above. It has the same beneficial effect as the OLED touch display panel provided by the preceding embodiments.

In addition, as shown in FIG. 3A, the touch display device further comprises driving components or driving circuits such as a FPC, a touch IC 14 and a driving IC 17 disposed in the non-display region of the OLED touch display panel.

It should be noted that in the present application, the touch display device can be any product or component with the display function such as a television, a digital photo frame, a mobile phone or a tablet computer etc.

This disclosure provides an OLED touch display panel and a touch display device. The OLED touch display panel comprises a TFT back plate and a cathode layer disposed on the TFT back plate. The cathode layer comprises a plurality touch leads which are insulated from each other and a plurality self-capacitance electrodes which are insulated from each other and arranged in a form of a matrix. The touch leads extend to a non-display region of the OLED touch display panel. Each touch lead is connected with one self-capacitance electrode, and resistance values of the touch leads connected with the self-capacitance electrodes of a same row are all consistent.

On the one hand, since the cathode layer comprises a plurality of self-capacitance electrodes insulated from each other and arranged in a form of matrix, the cathode layer can be used as the self-capacitance electrodes. That is, when the OLED touch display panel is in a display phase, a voltage is applied to the cathode layer such that the cathode layer and an anode on the TFT back plate form an electric field, thereby exciting an organic light emitting layer located between the cathode layer and the anode to emit light. When the OLED touch display panel is in a touch phase, each of the self-capacitance electrodes can be electrically connected with a metal film layer in the non-display region through the touch lead connected with it. The metal film layer is further connected with the ground end or a low voltage end, so as to enable the self-capacitance electrode to constitute self-capacitance with the ground end or the low voltage end. When the plurality of self-capacitance electrodes are arranged in the form of a matrix, N rows and M columns of self-capacitance electrodes can be scanned so as to determine a touch position according to coordinates of a self-capacitance whose capacitance value is changed. In this way, the In-Cell touch structure of a simple structure can be achieved by using the cathode layer as the self-capacitance electrodes. Therefore, the solution of forming a multi-layer thin film touch structure on an outer side of an encapsulation cover plate is not required, so the structure of the OLED touch display panel is simplified.

On the other hand, the metal film layer connects not only with the ground end or the low voltage end of the non-display region, but also with a touch IC in the non-display region disposed on the FPC to output the signal collected by the touch lead to the touch IC. In such a case, since the resistance values of the touch leads connected with the self-capacitance electrodes of the same row are all consistent, the resistance values of the touch leads per se connected with the self-capacitance electrodes of the same row have the same influence to the signal inputted by each touch lead to the self-capacitance electrode connected therewith and to the collected signal outputted to the touch IC, thus, by performing equal resistance design to the touch lead, the influence of the IR-drop phenomenon caused by lead resistance difference on the display and touch performance of the OLED touch display panel can be reduced.

The disclosure mentioned above is only specific embodiments of this disclosure, but the protection scope of this disclosure shall not be limited thereto. Any variation or substitution that can be easily conceivable by the skilled person within the technical range disclosed in this disclosure shall fall within the protection scope of this disclosure. Therefore, the protection scope of this disclosure shall be subject to the protection scope of the claims.

We claim:

1. An OLED touch display panel, comprising a TFT back plate and a cathode layer disposed on the TFT back plate,
   wherein the cathode layer comprises a plurality of touch leads which are insulated from each other and a plurality of self-capacitance electrodes which are insulated from each other and arranged in a form of a matrix, and the touch leads extend to a non-display region of the OLED touch display panel;
   wherein each of the touch leads is connected with one of the self-capacitance electrodes, and resistance values of the touch leads connected with the self-capacitance electrodes of a same row are all consistent;
   wherein in a left half part of the OLED touch display panel, from left to right, widths of touch leads connected with self-capacitance electrodes of a first column are the same as widths of touch leads connected with self-capacitance electrodes of a second column, and lengths of the touch leads connected with the self-capacitance electrodes of the first column are the same as lengths of the touch leads connected with the self-capacitance electrodes of the second column; and except for the self-capacitance electrodes of the first column, lengths and widths of touch leads connected with self-capacitance electrodes of other columns increase successively; and
   wherein in a right half part of the OLED touch display panel, from right to left, widths of touch leads connected with self-capacitance electrodes of a first column are the same as widths of touch leads connected with self-capacitance electrodes of a second column, and lengths of the touch leads connected with the self-capacitance electrodes of the first column are the same as lengths of the touch leads connected with the self-capacitance electrodes of the second column; and except for the self-capacitance electrodes of the first column, lengths and widths of touch leads connected with self-capacitance electrodes of other columns increase successively.

2. The OLED touch display panel according to claim 1, wherein the self-capacitance electrode is in a rectangular shape;
   wherein in a left half part of the OLED touch display panel, from left to right, areas of the self-capacitance electrodes increase gradually; and
   wherein in a right half part of the OLED touch display panel, from right to left, areas of the self-capacitance electrodes increase gradually.

3. The OLED touch display panel according to claim 2, wherein in any one of the left half part and the right half part of the OLED touch display panel, a sum of widths of touch leads connected with self-capacitance electrodes of a same row is less than or equal to 10% of a width of a self-capacitance electrode with the largest area in the same row; and wherein width directions of the touch leads and width directions of the self-capacitance electrodes are both perpendicular to extending directions of the touch leads.

4. The OLED touch display panel according to claim 3, wherein in the left half part of the OLED touch display panel, from left to right, the widths of the touch leads connected with the self-capacitance electrodes of the first column and the second column is the same as a width of a sub-pixel of the OLED touch display panel.

5. The OLED touch display panel according to claim 3, wherein in the right half part of the OLED touch display panel, from right to left, the widths of the touch leads connected with the self-capacitance electrodes of the first column and the second column is the same as a width of a sub-pixel of the OLED touch display panel.

6. The OLED touch display panel according to claim 1, further comprising a plurality of L-shape baffles disposed on the TFT back plate and a plurality of strip-shape baffles parallel to a horizontal edge of the L-shape baffle, wherein in a left half part of the OLED touch display panel, from left to right, sizes of the plurality of L-shape baffles increase successively, or in a right half part of the OLED touch display panel, from right to left, sizes of the plurality of L-shape baffles increase successively.

7. The OLED touch display panel according to claim 6, wherein vertical edges of two adjacent L-shape baffles are respectively connected with two ends of one of the strip-shape baffles, the vertical edges of the two adjacent L-shape baffles and the one of the strip-shape baffles define a touch region, and the horizontal edges of the two adjacent L-shape baffles define a lead region connected with the touch region.

8. The OLED touch display panel according to claim 7, wherein the L-shape baffles and the strip-shape baffles partition the cathode layer into the self-capacitance electrodes located within the touch regions and the touch leads located within the lead regions.

9. The OLED touch display panel according to claim 6, wherein in the left half part of the OLED touch display panel, from left to right, or in the right half part of the OLED touch display panel, from right to left, opening directions of two adjacent L-shape baffles for defining the touch region of the first column are arranged oppositely, and opening directions of two adjacent L-shape baffles of other columns are the same.

10. The OLED touch display panel according to claim 9, wherein except for the touch regions of the first row, a horizontal edge of an inner-most L-shape baffle in a row for defining a touch region of a previous row is shared by a strip-shape baffle for defining a touch region of a next row.

11. The OLED touch display panel according to claim 6, further comprising a pixel definition layer disposed on the TFT back plate, wherein the pixel definition layer comprises pixel partitions crossing each other transversely and longitudinally and an opening enclosed by the pixel partitions; and
wherein the L-shape baffle and the strip-shape baffle are located on a side of the pixel partitions away from the TFT back plate.

12. The OLED touch display panel according to claim 6, wherein shapes of longitudinal sections of the L-shape baffle and the strip-shape baffle are inverted trapezoids, and the longitudinal sections are perpendicular to the TFT back plate.

13. The OLED touch display panel according to claim 6, further comprising spacers located within the touch region and disposed on the TFT back plate, wherein the L-shape baffle and the strip-shape baffle are located in a same layer with the spacers, and have a same material with the spacers, and the L-shape baffle and the strip-shape baffle are made of negative photoresist.

14. The OLED touch display panel according to claim 13, wherein the spacers comprise a plurality of first sub-spacers and a plurality of second sub-spacers;
wherein the plurality of first sub-spacers are arranged in a form of a matrix, and the second sub-spacers are located between two adjacent rows and two adjacent columns of first sub-spacers; and
wherein an extending direction of the first sub-spacers is perpendicular to an extending direction of the second sub-spacers.

15. The OLED touch display panel according to claim 11, further comprising an organic material functional layer, the organic material functional layer comprises a hole injection layer, a hole transport layer, a padding layer, a buffer layer, an organic light emitting layer and an electron transport layer successively located on a side of the TFT back plate close to the cathode layer;
wherein the hole injection layer, the hole transport layer, the buffer layer and the electron transport layer completely cover a display region of the TFT back plate, and the organic light emitting layer and the padding layer correspond to positions of the openings.

16. The OLED touch display panel according to claim 11, further comprising an organic material functional layer, the organic material functional layer comprising a hole injection layer, a hole transport layer, a padding layer, a buffer layer, an organic light emitting layer and an electron transport layer successively located on a side of the TFT back plate close to the cathode layer and corresponding to positions of the openings.

17. The OLED touch display panel according to claim 1, wherein the cathode layer comprises at least one of metallic magnesium and metallic silver.

18. A touch display device, comprising the OLED touch display panel according to claim 1.

* * * * *